US008217683B2

(12) United States Patent
Le Guillou

(10) Patent No.: US 8,217,683 B2
(45) Date of Patent: Jul. 10, 2012

(54) PHASE-DETECTOR FOR DETECTING PHASE DIFFERENCE OF [PI]2N

(75) Inventor: Yann Le Guillou, Caen (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/060,914

(22) PCT Filed: Aug. 25, 2009

(86) PCT No.: PCT/IB2009/053733
§ 371 (c)(1),
(2), (4) Date: Feb. 25, 2011

(87) PCT Pub. No.: WO2010/023627
PCT Pub. Date: Mar. 4, 2010

(65) Prior Publication Data
US 2011/0148467 A1 Jun. 23, 2011

(30) Foreign Application Priority Data
Aug. 27, 2008 (EP) .................................... 08290802

(51) Int. Cl.
*H03D 13/00* (2006.01)
(52) U.S. Cl. .................. 327/2; 327/3; 327/5; 324/76.77; 329/345; 455/214
(58) Field of Classification Search .................. 327/2, 3, 327/5, 7, 10; 324/76.52, 76.54, 76.56, 76.74, 324/76.77–76.79, 76.83, 86; 329/345; 455/214
See application file for complete search history.

(56) References Cited

U.S. PATENT DOCUMENTS

| 2,570,156 | A | | 10/1951 | Reiss |
| 3,840,817 | A | | 10/1974 | Seki |
| 4,100,500 | A | * | 7/1978 | Ohsawa et al. ............... 329/337 |
| 4,870,303 | A | * | 9/1989 | McGinn .......................... 327/2 |
| 5,151,624 | A | * | 9/1992 | Stegherr et al. ............... 327/356 |
| 5,343,097 | A | * | 8/1994 | Takeuchi ......................... 327/3 |
| 6,300,803 | B1 | * | 10/2001 | Matsui ............................. 327/3 |

(Continued)

FOREIGN PATENT DOCUMENTS
GB 2 423 427 A 8/2006
(Continued)

OTHER PUBLICATIONS

Cowles, J., et al. "A Calibrated RF/IF Monolithic Vector Analyzer," IEEE MTT-S International Microwave Symposium Digest, vol. 3, pp. 2163-2166 (May 2001).

(Continued)

*Primary Examiner* — Patrick O'Neill

(57) ABSTRACT

A basic symmetric $\Pi/2$ phase-detector receives four control signals that control a differential current at the detector's output. Each respective control signal is a linear combination of a respective pair of signals chosen from a first input signal, its logic complement, a second input signal and the logic complement of the latter. Operation is based on time-averaging the differential current, the result being zero at a phase difference of $\Pi/2$. By means of adding one or more additional current sources to the output, controlled by one or more of the control signals, the basic operation is skewed. The time-averaged output current is now made zero only at a value of the phase difference different from $\Pi/2$. In an embodiment with uniform current sources and resistors, the modified detector is configured for a phase difference of $\Pi/2^N$.

5 Claims, 17 Drawing Sheets

U.S. PATENT DOCUMENTS

| | | |
|---|---|---|
| 7,130,604 B1 | 10/2006 | Wong et al. |
| 2003/0038682 A1 | 2/2003 | Kushner et al. |
| 2003/0119456 A1 | 6/2003 | Maligeorgos |
| 2005/0233723 A1 | 10/2005 | Gomez et al. |
| 2006/0083335 A1 | 4/2006 | Seendripu et al. |
| 2006/0205370 A1 | 9/2006 | Hayashi et al. |
| 2007/0075758 A1 | 4/2007 | Fiedler |
| 2010/0283526 A1 | 11/2010 | Van Sinderen et al. |

FOREIGN PATENT DOCUMENTS

| | | |
|---|---|---|
| WO | 2006/063358 | 6/2006 |

OTHER PUBLICATIONS

Brekelmans, J., et al. "Pre-Study Result RF Tuner for TV on Mobile in CMOS090," Philips Research Technical Note, 74 pgs. (Feb. 2006).

TDK Semiconductor Corp. "71M6511/71M6511H Power Meter IC," Datasheet, 56 pgs. (Mar. 2005).

Weldon, J., et al. "A 1.75-GHz Highly Integrated Narrow-Band CMOS Transmitter with Harmonic-Rejection Mixers," IEEE J. of Solid-State Circuits, vol. 36, No. 12, pp. 2003-2015 (Dec. 2001).

Valero-Lopez, A., et al. "Self-Calibrated Quadrature Generator for WLAN Multistandard Frequency Synthesizer," IEEE J. of Solid State Circuits, vol. 41, No. 5, pp. 1031-1041 (May 2006).

IEC 62002-1 "Mobile and portable DVB-T/H radio access—Part1: Interface specification," 2d. ed., 72 pgs. (May 2008).

International Search Report and Written Opinion for Int'l Patent Appln. No. PCT/IB2009/053733 (Nov. 4, 2009).

* cited by examiner

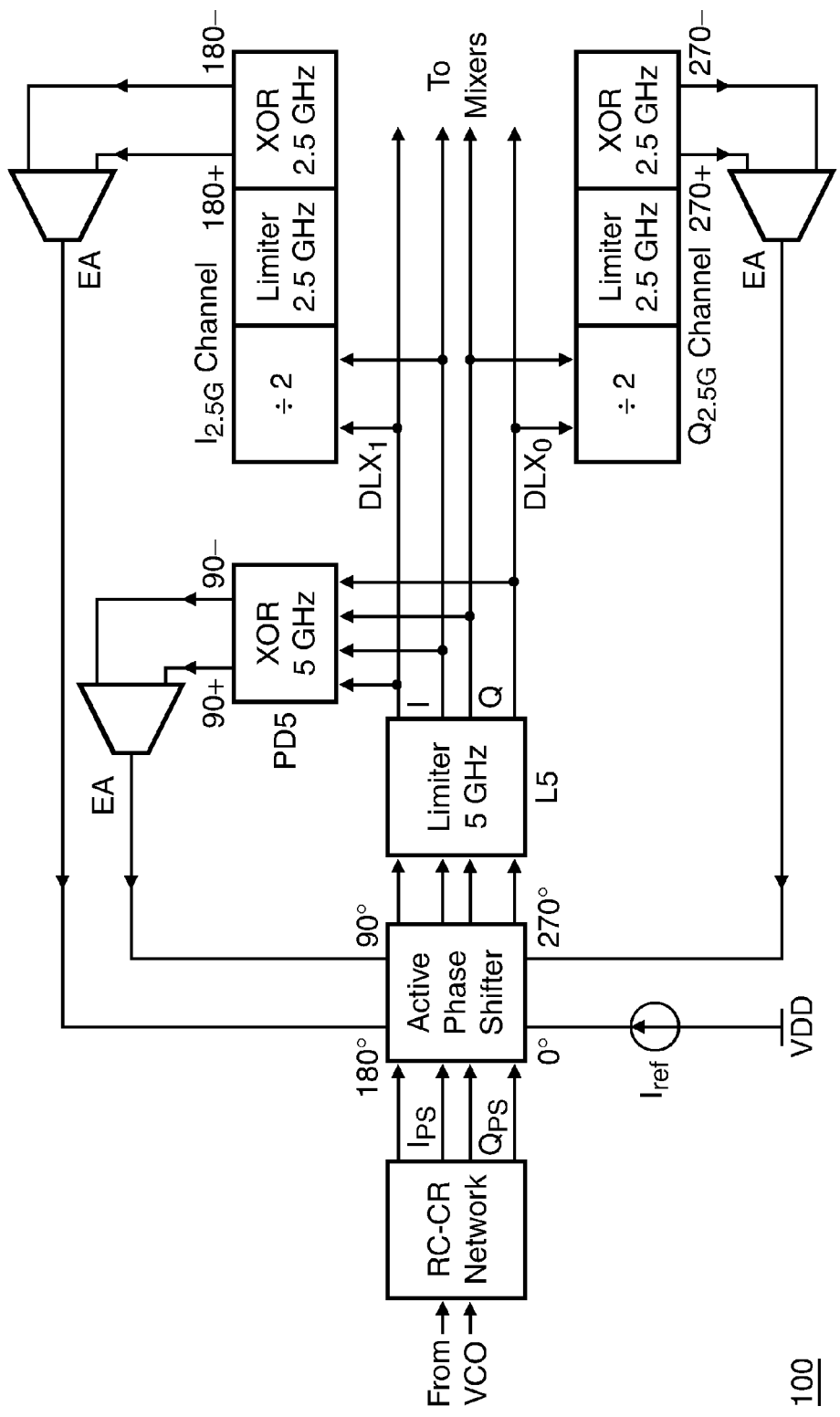
FIG. 1A - Related Art

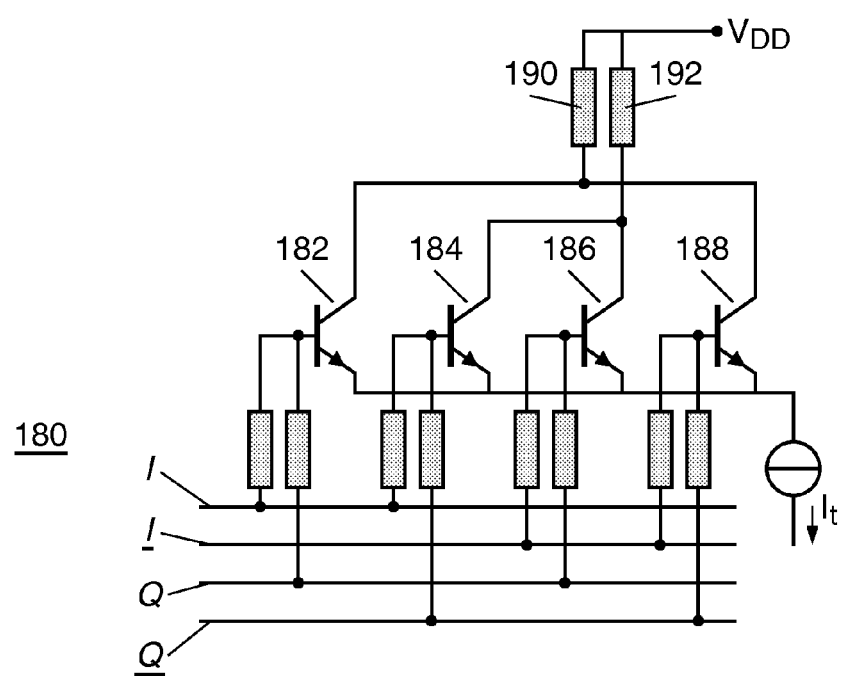
FIG. 1B - Related Art

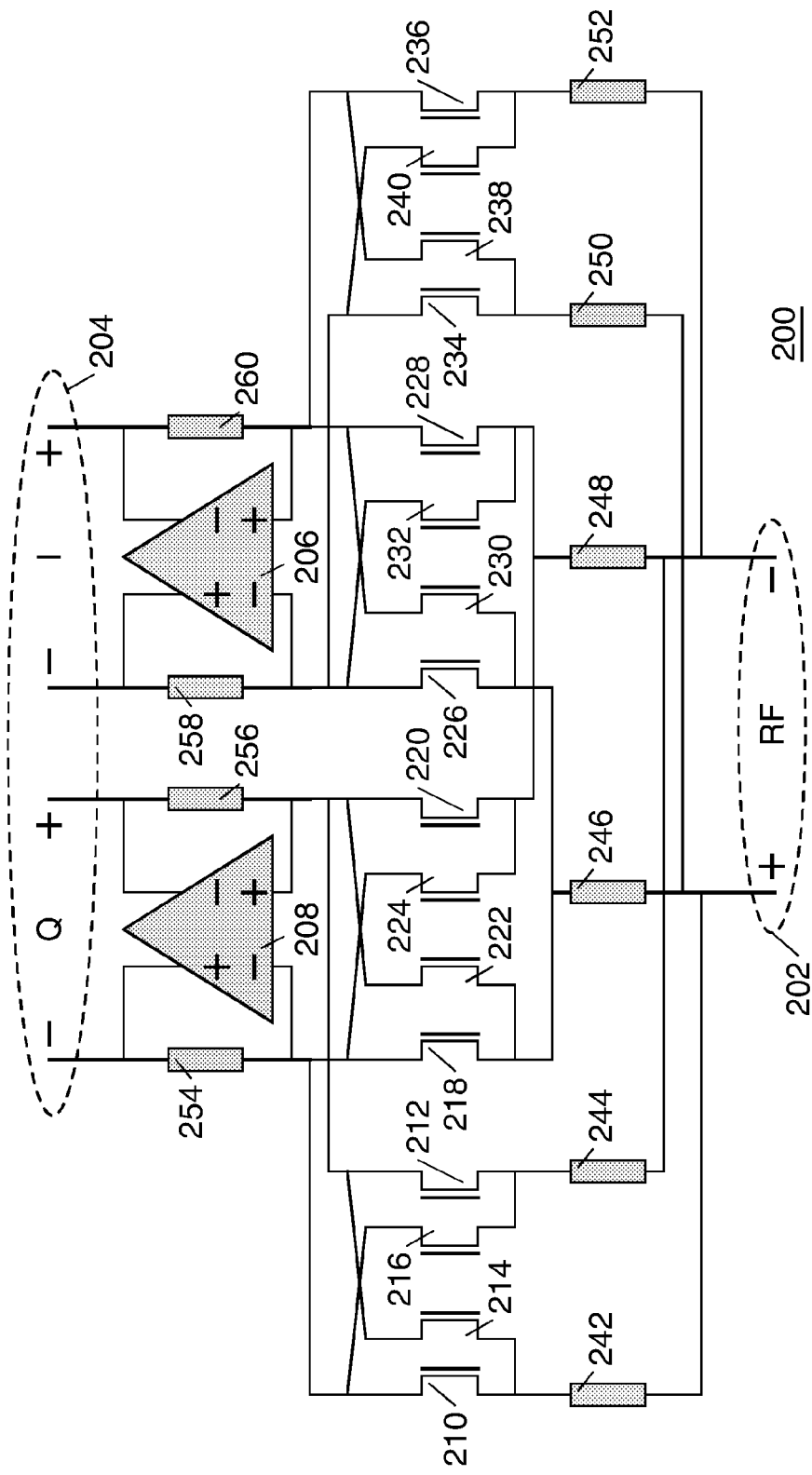
FIG. 2 - Related Art

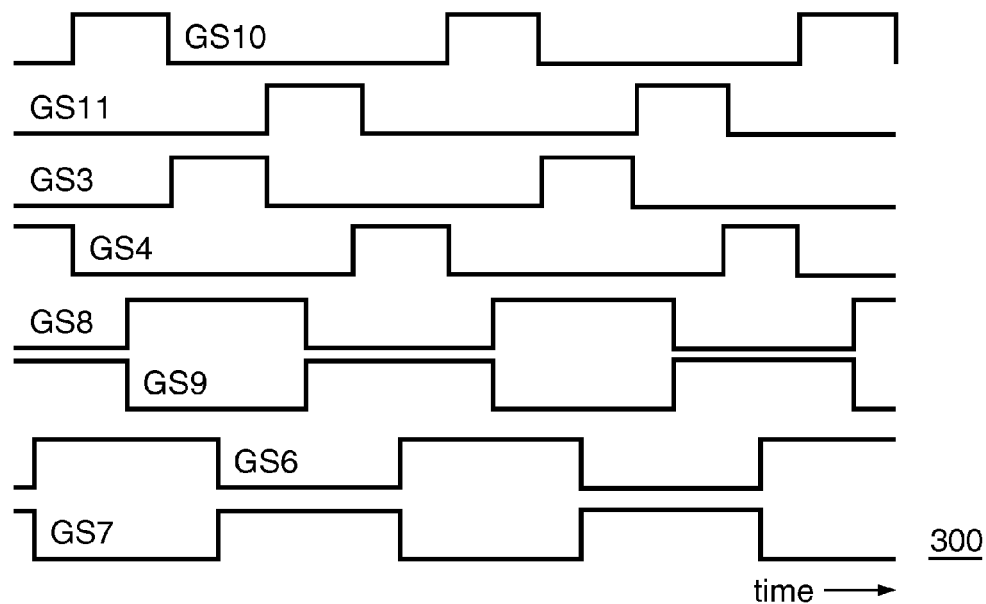
FIG. 3 - Related Art
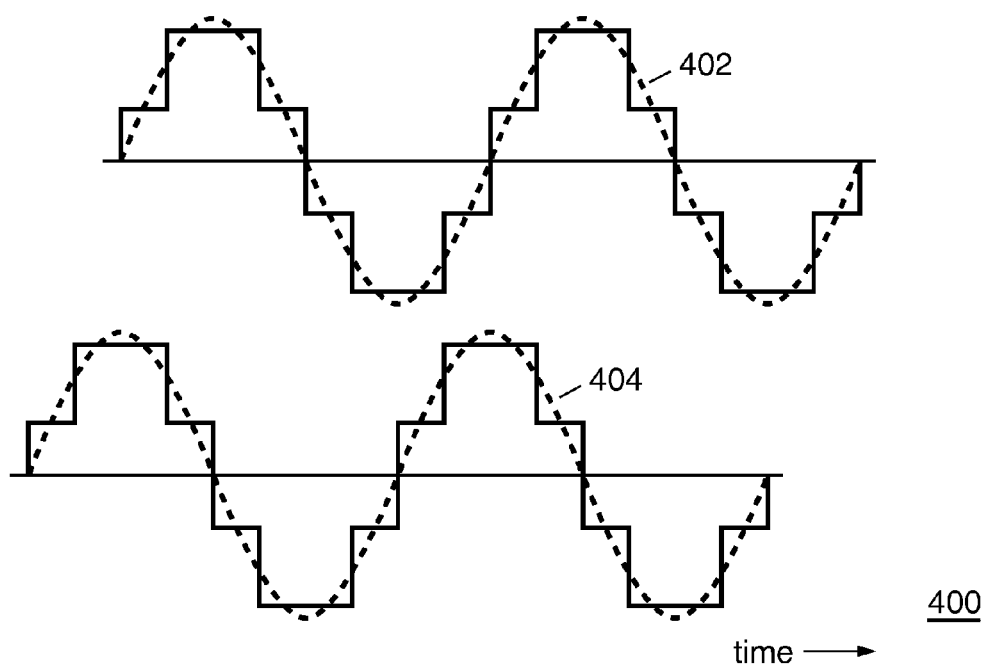
FIG. 4 - Related Art

| Band | Lower frequency | Upper frequency | Unit |
|---|---|---|---|
| VHF3 | 174 | 240 | MHz |
| UHF | 470 | 862 | MHz |
| L-band Europe | 1452 | 1492 | MHz |
| L-band US | 1675 | 1670 | MHz |
| S-band Europe | 2170 | 2200 | MHz |
| S-band Asia | 2605 | 2655 | MHz |

PHASE-DETECTOR FOR DETECTING PHASE DIFFERENCE OF [PI]2N

FIELD OF THE INVENTION

The invention relates to an electronic device comprising electronic circuitry with a phase-detector, and to a phase-detector for use in such device.

BACKGROUND OF THE INVENTION

With an increase in the adoption of wireless communication standards in small handheld devices such as cellular phones, the amount of self-generated interference in those devices increases. The various communication interfaces are often required to coexist. Harmonic reject (HR) mixers may help mitigate coexistence issues, but harmonic rejection properties of HR mixers greatly depend on the accuracy of the phase difference between local oscillator (LO) waveforms.

Switching mixers with rejection properties on one or more odd higher harmonics are well known, see, e.g., J. A. Weldon et al., "A 1.75-GHz highly integrated narrow-band CMOS transmitter with harmonic-rejection mixers", IEEE Journal of Solid-State Circuits, Vol. 36, No. 12, December 2001, pp 2003-2015. A harmonic-rejection (HR) mixer allows simplifying the RF filtering. A typical HR mixer known in this field is an active (Gilbert) type of mixer. However, passive mixers are known to provide a better 1/f noise and higher linearity. On the other hand, a passive HR mixer is more difficult to implement.

HR mixers are also disclosed in non pre-published European patent application 072 90 983.1, filed Aug. 7, 2007 for "Harmonic Rejection Mixer Unit and Method for Performing a Harmonic Rejection Mixing" (attorney docket PH 008194).

Reference is also made to A. Y. Valero Lopez, S. T. Moon, E. Sánchez-Sinencio, "Self-Calibrated Quadrature Generator for WLAN Multistandard Frequency Synthesizer", IEEE J. of Solid State Circuits., May 2006, vol. 41, no 5, pp. 1031-1041.

SUMMARY OF THE INVENTION

This invention presented a background calibration scheme for 45° phase difference LO signals. This calibrations scheme enables to improve the harmonic rejection of HR mixers leading to a relaxation of the amount of filtering required for co-existence of cellular and connectivity transceivers with mobile TV receivers. It results a higher level of integration and miniaturization for mobile TV receivers while maintaining high level of performances even when cellular and connectivity transceivers co-exist with mobile TV receivers.

More specifically, the inventor proposes an electronic device as specified by claim 1 or 3. In effect, the phase-detector used in the device of the invention is centered on a symmetric $\pi/2$ basic phase-detector. The basic detector receives four input signals, being a linear combination of always two of the first and second signals (e.g., signal A and signal B), between which the phase difference is to be detected, and their logic complements (signal $\overline{A}$ and signal $\overline{B}$). The basic phase-detector supplies a zero output, i.e., the detector is balanced, if the phase difference between the first and second signals is $\pi/2$. Operation is based on time-averaging the differential output current of the basic phase-detector. In order to be able to use the $\pi/2$ basic phase-detector for detecting phase differences other than $\pi/2$, the inventor now proposes to skew the balance by means of connecting additional current sources to the output of the basic phase-detector, each additional current source being controlled by one of the four input signals mentioned above. As a result of the skewing, brought about by the additional controlled current sources, the time-averaging of the differential output current is only brought to zero at a specific phase difference between the first and second signals that is different from $\pi/2$. For example, using uniform resistors and current sources throughout the circuit of the phase-detector in the invention, a fractional phase-difference of P/Q times $\pi$ can be obtained, wherein P and Q are integers and are indicative of the numbers of additional current sources connected to the plus node or the minus node of the phase-detector's output.

The skewing configuration in the phase-detector of the invention may result in an uneven load on the signal lines carrying the first and second signals. That is, the signal lines are not all tapped equally if only the skewing is taken care of, which may result in an unbalance brought about by delays. The inventor therefore proposes to add load balancing circuitry to the phase detector of the invention, by means of adding further additional current sources controlled by any of the four input signals A, B, $\overline{A}$ and $\overline{B}$. However, these additional current sources are not connected to the output of the phase-detector of the invention so as to not affect the differential output current. They merely serve to implement an even loading of all signal lines for input signals A, B, $\overline{A}$ and $\overline{B}$. These embodiments are addressed in claims 3 and $\overline{4}$.

A further embodiment of the phase-detector in the invention may use a programmable configuration of current sources to be added for skewing the output of the phase-detector.

Accordingly, the invention relates to a modified basic symmetric $\pi/2$ phase-detector that receives four control signals. The control signals control a differential current at the detector's output. Each respective control signal is a linear combination of a respective pair of signals chosen from a first input signal, its logic complement, a second input signal and the logic complement of the latter. Operation is based on time-averaging the differential current, the result being zero at a phase difference of $\pi/2$. By means of adding one or more additional current sources to the output, controlled by one or more of the control signals, the basic operation is skewed. The time-averaged output current is now made zero only at a value of the phase difference different from $\pi/2$. In an embodiment with uniform current sources and resistors, the modified detector is configured for a phase difference of $\pi/2^N$.

BRIEF DESCRIPTION OF THE DRAWINGS

The invention is explained in further detail, by way of example and with reference to the accompanying drawing, wherein:

FIG. 1 is a block diagram of a self-calibration scheme for a local oscillator;

FIGS. 2-4 address a 3rd and 5th harmonic reject (HR) mixer;

FIGS. 5-6 address a multi-band/multi-standard TV-on-Mobile receiver;

Throughout the Figures, similar or corresponding features are indicated by same reference numerals.

DETAILED DESCRIPTION OF THE DRAWINGS

Figure 5:
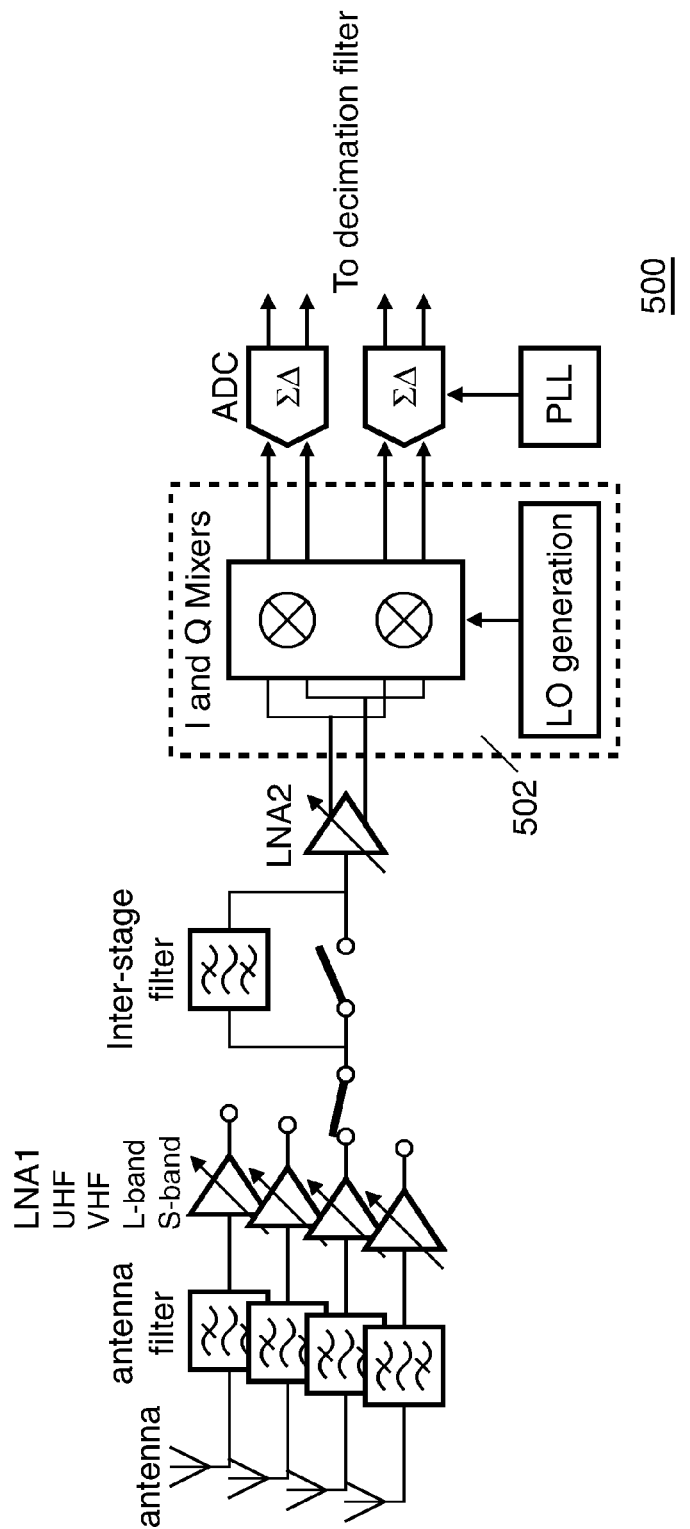

FIG. 1 is a block diagram of a self-calibration scheme for local oscillator (LO) signals having a 90° phase shift, as disclosed in A. Y. Valero Lopez, S. T. Moon, E. Sánchez-Sinencio, "Self calibrated Quadrature Generator for WLAN Multistandard Frequency Synthesizer", IEEE J. of Solid State Circuits., May 2006, vol. 41, no 5, pp. 1031-1041. The quadrature outputs for IEEE 802.11b (2.4 GHz) are generated with the first divide-by-two stage of the pre-scaler, since the VCO is already running at twice the required frequency, and the signals for IEEE 802.11a are generated through the quadrature generator.

In the configuration of FIG. 1, the output of a first-order RC-CR network generates quadrature outputs from the differential VCO output. The output of the RC-CR network is passed through a limiter (L5) to reduce the amplitude mismatch in the quadrature signals. The signal is then fed to a phase-detector (PD5) with equal delays in all the branches. The phase-detector generates a control signal that is filtered and applied to a current controlled active phase shifter, creating a delay-locked loop (DLL) that adjusts the phase difference between the branches to 90°. Since the phase shift introduced by each branch of the RC-CR network is different, the alignment of each differential signal cannot be considered identical to 180° and needs to be calibrated as well. In order to perform the calibration, the output of the limiter (L5) is also applied to divide-by-two stages that map the 180° phase difference between each differential output branch (at 5 GHz) into a 90° phase difference at half the frequency (2.5 GHz) and that measure the relative phase error between each pair of the differential signals. Each divide-by-two stage has a limiter and phase-detector similar to L5 and PD5. An error amplifier (EA) maps the error signal generated by the phase-detector to a control current for the active phase shifter.

Phase-detector PD5 is a key building block in the calibration scheme. It is in charge of detecting the phase errors in the quadrature signals and generating a DC voltage proportional to the phase error. The phase-detector is implemented using a wideband four quadrant analog multiplier which provides an output whose average is proportional to the phase difference of the inputs.

Diagram 180 shows the schematic of phase-detector PD5. Detector PD5 is fully symmetrical with respect to the I and Q inputs, eliminating the need for cross-coupled mixers. The output magnitude can be directly controlled by the tail current $I_t$. The operation of detector PD5 is similar to a conventional XOR, but without the unbalanced delays from the inputs.

The resistive network at each input of detector PD5 operates as a common-mode detector. When the input signals I, Q and their logic complements $\overline{I}$ and $\overline{Q}$, are aligned at 90°, at any given time, only one of transistors 182, 184, 186 and 188 is ON, another one of transistors 182-188 is OFF, and the remaining two of transistors 182-188 have the same voltage at their inputs (the common-mode voltage of the inputs). Under this condition, only one transistor will have the complete tail current flowing through it. If the total output current is integrated in an input cycle, the result will be zero when the input signals have a 90° phase difference. If the relative phase differs from 90°, the integration of the output current in one period will yield a finite current. The magnitude of this residual current is proportional to the phase deviation. The output current of phase-detector PD5 is converted to a voltage through load resistors 190 and 192.

FIGS. 2-4 relate to a 3rd and 5th LO harmonic reject (HR) mixer. A square multiplication is performed combined with a gain-modulation of the RF signal (with a suitably shaped LO signal) to obtain the envelope shown by the black curve. The result is a HR mixer with better noise and inter-modulation properties, mainly because no signal cancellations occur.

HR mixers are also disclosed in non pre-published European patent application 072 90 983.1, filed Aug. 7, 2007 for "Harmonic Rejection Mixer Unit and Method for Performing a Harmonic Rejection Mixing" (attorney docket PH 008194).

FIG. 2 in the drawing appended to the current document is copied from EP 072 90 983.1 and is a block diagram of a HR mixer 200. Mixer 200 is a quadrature mixer. Mixer 200 comprises an RF (radio/frequency) input 202 and an IF (intermediate frequency) output 204. Output 204 provides the in-phase output signal "I" and an output signal "Q" whose phase is shifted over 90° relative to signal "I". Mixer 200 comprises amplifiers 206 and 208, whose differential inputs are connected to input 202 via a switching network and whose differential outputs provide signals "I" and "Q". The switching network at input 202 is made up of switching FETs 210, 212, 214, 216; switching FETs 218, 220, 222, 224; switching FETs 226, 228, 230, 232; switching FETs 234, 236, 238, 240; and resistors 242, 244, 246, 248, 250 and 252. FETs 210 and 214 have their main current paths connected to input 202 via resistor 242. FETs 212 and 216 have their main current paths connected to input 202 via resistor 244. FETs 218, 222, 226 and 230 have their main current paths connected to input 202 via resistor 246. FETs 220, 224, 228 and 232 have their main current paths connected to input 202 via resistor 248. FETs 234 and 238 have their main current paths connected to input 202 via resistor 250. FETs 236 and 240 have their main current paths connected to input 202 via resistor 252. The input network together with resistors 254, 256, 258 and 260, configure amplifiers 206 and 208 as summing amplifiers.

FIG. 3 is a diagram 300 of the control signals used to switch FETs 210-240. FETs 226 and 228 are controlled by a signal GS10. FETs 230 and 232 are controlled by a signal GS11. FETs 218 and 220 are controlled by a signal GS3. FETs 222 and 224 are controlled by a signal GS4. FETs 210 and 212 are controlled by a signal GS8. FETs 214 and 216 are controlled by a signal GS9. FETs 234 and 236 are controlled by a signal GS6. FETs 238 and 240 are controlled by a signal GS7. Signals GS3-GS11 are derived from a local oscillator (not shown). As a result, signals "I" and "Q" form the weighted sum of the switched input signals, effectively forming the result of mixing the input signal at input 202 with control signals generated by the local oscillator.

FIG. 4 is a diagram 400 of the effective resulting mixing waveforms for the "I" and "Q" signals. The mixing waveforms can be thought of as being build up by selectively combining the control signals of FIG. 3 so as to approximate the sine shape.

HR mixer 200 performs a square multiplication combined with a gain-modulation of the RF signal (with a suitably shaped LO signal) in order to obtain the envelope shown by curves 402 and 404. The result is better noise properties and inter-modulation properties, mainly because no signal cancellations occur.

FIG. 5 is a block diagram of a multi-band/multi-standard (DVB-H, DVB-T, ISDB-T, T-DMB, S-DMB, DVB-SSB, DMB-T) TV-on-Mobile receiver 500. Receiver 500 has a traditional Zero Intermediate Frequency (ZIF) architecture. The architecture supports VHF3, UHF, L-band and S-band as defined in Table 600 of FIG. 6.

For down-conversion of VHF3 and UHF, a HR mixer 502 is used, e.g., mixer 200, to relax the antenna requirements and inter-stage filter requirements for co-existence with cellular functionality and connectivity. HR mixer 200 has a relative low conversion-gain for the $3^{rd}$ and $5^{th}$ LO harmonics in order to prevent unwanted down-conversion of, for instance, GSM, DCS, UMTS, BT and WLAN signals with harmonics of the LO. For the VHF-III input, mixer 200 suppresses unwanted down-conversion of UHF channels with harmonics of the LO.

For down-conversion of the L and S bands, a square-wave mixing signal is used. As the L and S bands are relatively narrow, higher in frequency and can be filtered more effectively, there is no need for HR mixers. A two times higher clock frequency is needed to generate quadrature components of the mixer oscillator signal.

As shown in FIG. 3, HR mixer 200 requires a number of 45° phase-difference digital waveforms. Harmonic suppression properties depend on the accuracy in time and amplitude (weighing in the mixer) of the individual waveforms. There is a dependence on waveform accuracy and harmonic rejection. It turns out that the most critical factor herein is a relative phase shift between the rooftop and main switching waveform. The phase shift must be lower than 0.2° to maintain a 60 dB of rejection, and lower than 2.2° to maintain a 40 dB of rejection on both $3^{rd}$ and $5^{th}$ LO harmonics.

As an example for co-existence issues in a hand-held terminal for the TV-on-Mobile receiver, consider the down-conversion of cellular and connectivity up-link signals. Sufficient dynamic range needs to be available to handle strong unwanted signals while receiving a weak wanted signal. An important use case in Europe is DVB-H desensitization by a GSM1800 burst signal down-converted with the $3^{rd}$ LO harmonics when operating in the UHF band. At IF, unwanted channel occur as co-channel interference.

When the GSM1800 power is at maximum (+30 dBm), the sensitivity degradation should not exceed 1.5 dB. See, e.g., IEC62002-1, "Mobile and portable DVB-T/H radio acces— Part 1: Interface specification", first edition 2005-10. The GSM1800 uplink signal is located in the 1710-1785 MHz band. Assuming a −15 dB antenna coupling and a 40 dB of rejection in the GSM filter (see, e.g., EPCOS, Saw components, LN60A, preliminary data sheet, March 2005, for such a filter), the up-link GSM1800 signal enters the DVB-H receiver with an input power of +30−15−40=−25 dBm. The inter-stage filter selectivity requirement in the 1710-1785 MHz range is 39 dB and 19 dB when the harmonic reject mixer rejects the $3^{rd}$ LO harmonic respectively by 40 dB and 60 dB.

From the point of view of power, area and thus integration and miniaturization, it is desirable to have the lowest selectivity requirements on the inter-stage filter. This can only be achieved if the phase error introduced between the 45° phase-shifted LO signal is minimized and calibrated. The minimization of the phase error can be achieved using some well-known design techniques such as a fully symmetrical design approach to avoid any systematic phase error; or the use of a synchronized divide-by-4, instead of two cascaded divide-by-2, to generate 45° phase shifted signals (see FIG. 16) It minimizes the phase uncertainty problem and meanwhile decreases phase noise. However, the calibration scheme and especially the self-calibration of 45° phase shifts is required to guarantee a minimum phase error due to mismatches. It enables to enhance the HR mixer performance.

Figure 16:
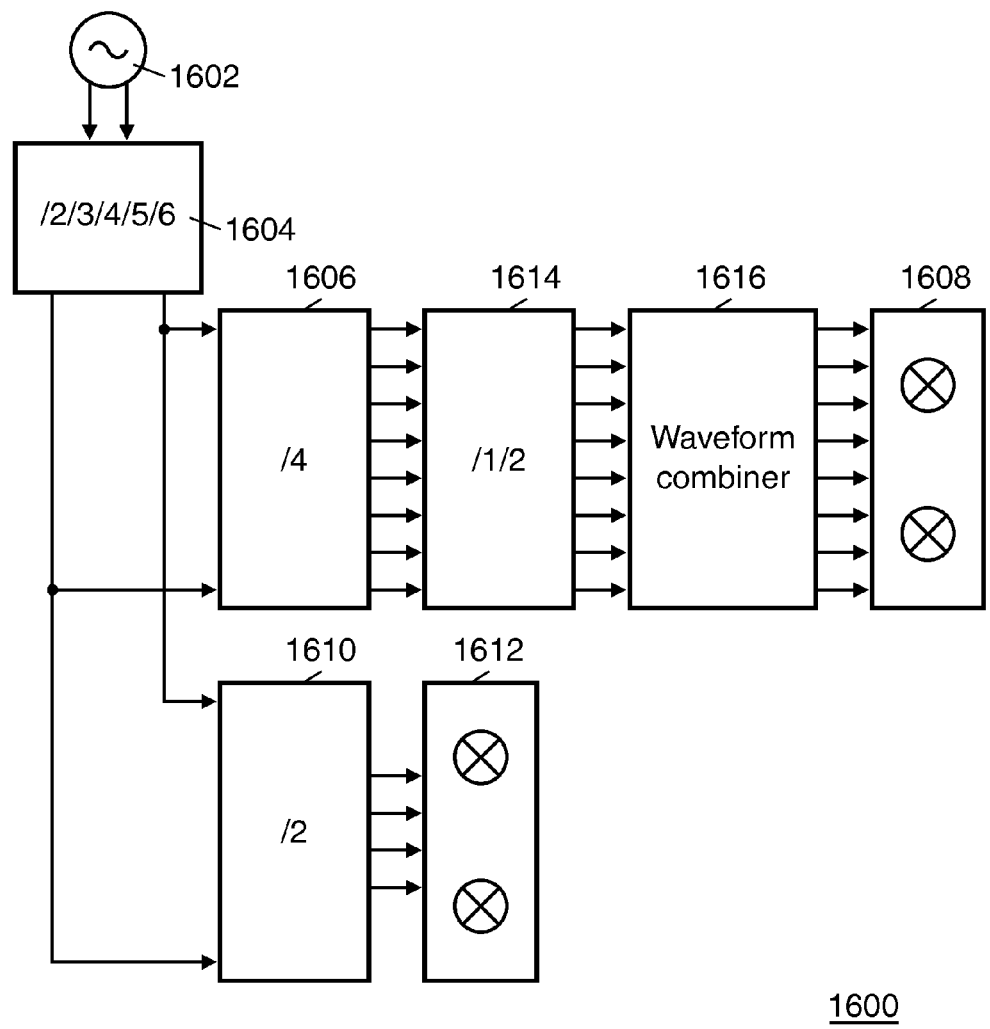
FIG. 16 is a block diagram illustrating the generation of LO (local oscillator) signals.

FIG. 16 illustrates the generation of LO signals mentioned above. Voltage-controlled oscillator (VCO) (or a digitally controlled oscillator (DCO)) 1602 operates in the range of 8.1-10.8 GHz. Oscillator 1602 supplies two output signals that are in anti-phase to a switchable pre-scaler 1604 that divides the oscillator signals down by a factor of 2, 3, 4, 5 or 6. The outputs of pre-scaler 1604 is supplied to a circuit 1606 for performing a divide-by-4 for eventually serving a VHF/UHF HR mixer 1608, and to a circuit 1610 for performing a divide-by-2 for serving an L-band/S-band mixer 1612. Both mixers 1608 and 1612 operate on quadrature signals I and Q. Circuit 1606 is coupled to a divider 1614 for dividing the output from circuit 1606 by unity for UHF and for dividing the output of circuit 1606 by two for VHF. Divider 1614 supplies its output to a waveform combiner 1616 that eventually controls mixer 1608.

The creation of the 4-level amplitude quantized sinusoid LO requires relative phase accuracy of 45° between the LO signals. Assuming the available clock signal has an accurate 50% duty cycle, the 45° phase difference between the LO signals can be obtained from a clock with frequency 4× the mixing frequency.

In A. Y. Valero Lopez et al., mentioned above, a self-calibration method is described for a 90° phase differences LO signal. This self-calibration method cannot handle 45° phase difference LO signals. Below, a new background calibration method is presented for a 45° phase differences LO signal. The implementation of key building blocks is presented, in particular, of a new π/4 phase detector.

Figure 7:
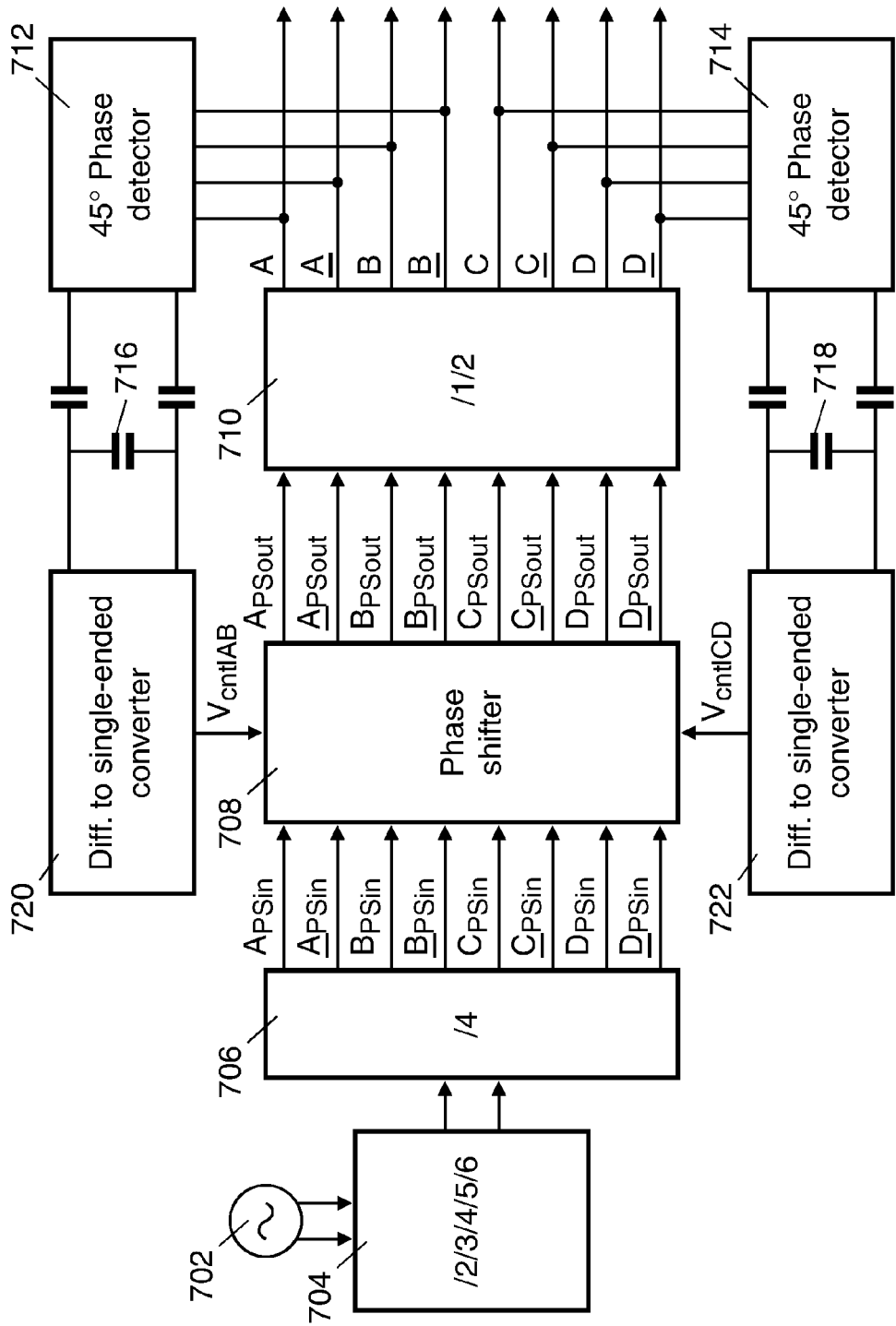
FIG. 7 is a block diagram of a generator for generating oscillator signals.

FIG. 7 is a block diagram of a generator 700 for generating the oscillator signals. An attractive scheme for generating the oscillator signals uses an oscillator 702 tunable from 8.1 to 10.8 GHz that supplies output signals to a pre-scaler 704 that is switchable between scaling factors 2, 3, 4, 5 and 6. Pre-scaler 704 supplies its output signals to a divider 706 to divide the output signals of pre-scaler 704 by four, thereby creating input signals for a phase-shifter 708. That is, shifter 708 receives input signals $A_{PSin}$, $B_{PSin}$, $C_{PSin}$, $D_{PSin}$, each successive pair thereof having a phase difference of 45°, and their logic complements $\overline{A_{PSin}}$, $\overline{B_{PSin}}$, $\overline{C_{PSin}}$ and $\overline{D_{PSin}}$, each successive pair whereof also having a phase difference of 45°. Shifter 708 controls a phase shift between $A_{PSin}$ and $B_{PSin}$ and between $C_{PSin}$ and $D_{PSin}$ and between the corresponding pairs of logically complementary signals. Shifter 708 supplies output signals $A_{PSout}$, $B_{PSout}$, $C_{PSout}$, $D_{PSout}$ and their logic complements $\overline{A_{PSout}}$, $\overline{B_{PSout}}$, $\overline{C_{PSout}}$ and $\overline{D_{PSout}}$. These output signals are supplied to a divider 710 that divides by unity for UHF and by a factor of two for VHF, thus supplying output signals A, B, C, D, and their logic complements $\overline{A}$, $\overline{B}$, $\overline{C}$ and $\overline{D}$. for supply to a waveform combiner (not shown). Generator 700 further comprises a 45° phase-detector 712 that receives as input the signals A, B, $\overline{A}$, and $\overline{B}$, and a 45° phase-detector 714 that receives as inputs the signals C, D, $\overline{C}$ and $\overline{D}$. Detectors 712 and 714 are configured so as to have equal delays in their signal paths. Configurations thereof are discussed below in detail. Detectors 712 and 714 each provide a respective differential control signal that is first averaged using capacitor 716 and 718, respectively, before it is single-ended converted by converters 720 and 722, respectively. The other capacitors shown in the connection between detector 712 and converter 720, and in the connection between detector 714 and converter 722 serve as DC-decoupling. Converter 720 supplies a control signal $V_{cntlAB}$ to shifter 708, and converter 722 supplies a control signal $V_{cntlCD}$ to shifter 708. Control signal $V_{cntlAB}$ controls the load of a delay cell in shifter 708, thus creating a delay-locked loop (DLL) that adjusts the phase difference between $AA$-$BB$ to 45°. A second DLL is used to calibrate to 45° the phase differences between the differential CC-DD LO signals. Differential-to-single-ended converter 720 and 722 map the error signal generated by phase detectors 712 and 714 into control signals for active phase shifter 708.

The 45° calibration can operate in background of the LO generation. Therefore, phase errors due to temperature gradient or transient events can continuously be monitored and controlled. For an example of a delay cell see FIG. 18.

Compared to the approach of A. Y. Valero Lopez et al., mentioned above, the calibration scheme of the invention neither requires RC-CR networks nor limiters. As a result, calibration of the 180° and 270° branches are not necessary and, in addition, active phase shifters cannot be current-controlled. The calibration loop is located as close as possible to the HR mixer to cancel accumulated phase errors of the 45° phase difference signals through the LO path.

Figure 17:
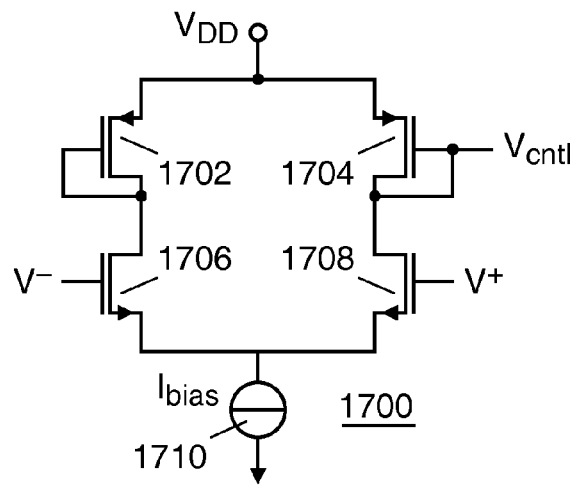
FIG. 17 is a circuit diagram of a differential-to-single-ended converter.

FIG. 17 illustrates an example of a differential-to-single-ended converter 1700. A general concern with an amplifier operating in an open-loop is offset. In converter 1700, as in all the building blocks of the background calibration loop, NMOS transistors 1706 and 1708 are used as the drivers with active PMOS loads 1702 and 1704. In deep-submicron CMOS technologies, properties of NMOS and PMOS transistors are very well matched and improve with the size of the transistors. Therefore, a good matching accuracy can be obtained. As can be seen in the diagram of FIG. 17, the differential input is supplied to the long tailed-pair formed by transistors 1706 and 1708 and current source 1710, and the single-ended control signal is taken off load transistor 1704.

Figure 18:
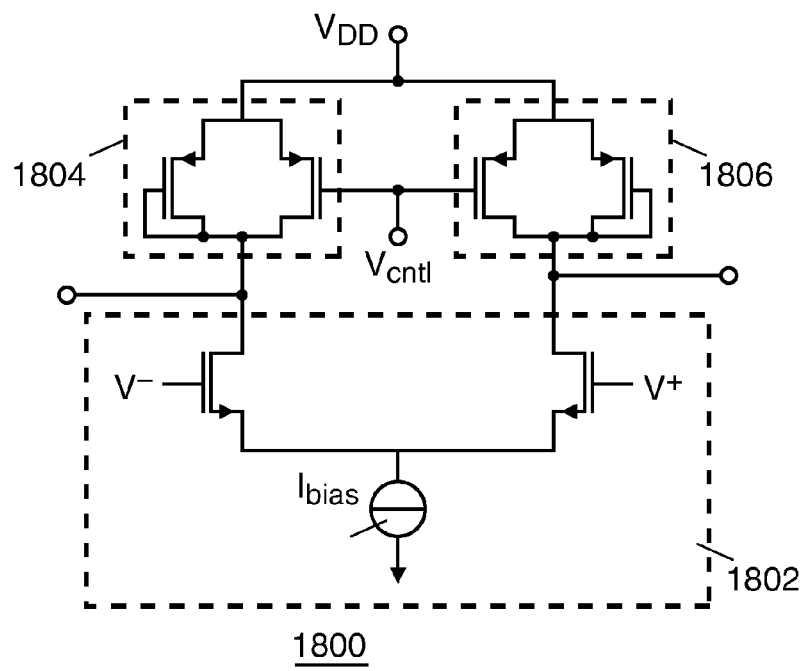
FIG. 18 is a circuit diagram of a delay cell.

FIG. 18 is a diagram of a delay cell 1800. Differential delay cell 1800 contains a source-coupled pair 1802 with resistive load elements 1804 and 1806, also referred to as "symmetric loads". Symmetric loads 1804 and 1806 each consist of a diode-connected PMOS device in shunt with an equally sized biased PMOS device. The delay changes with Vctrl since the effective resistance of load elements 1804 and 1806 also changes with Vctrl. Variable load elements 1804 and 1806 give good control of the delay and a high dynamic supply noise rejection.

Figure 19:
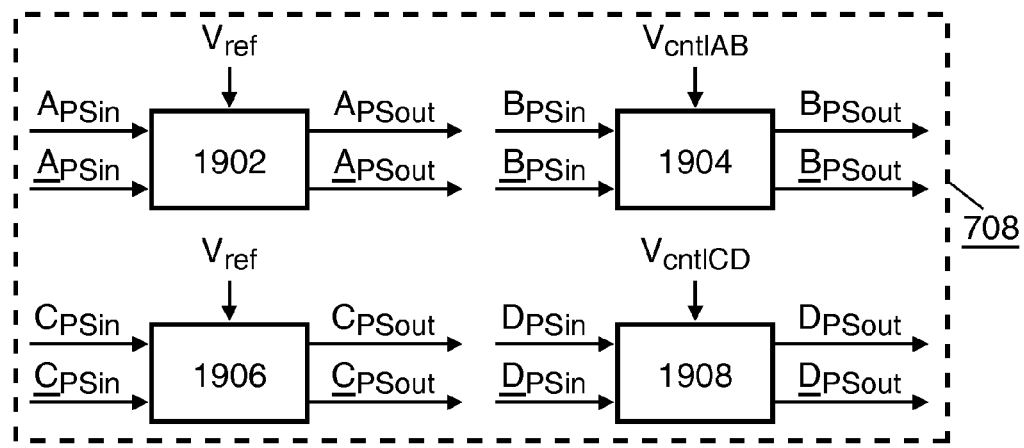
FIG. 19 is a block diagram of a phase shifter.

FIG. 19 illustrates an embodiment of active phase shifter 708. The configuration of shifter 708 shown enables to accurately control the 45° phase differences between the differential signals AA and BB, as well as between the differential signals CC and DD. Each of branches AA, BB, CC and DD is loaded by a respective differential delay cell 1902, 1904, 1906 and 1908 of the same configuration as cell 1800. The control of cells 1902 and 1906 remains constant, receiving a reference voltage $V_{ref}$, whereas cells 1904 and 1908 have their delays adjusted via a (variable) control signal $V_{cntlAB}$ and $V_{cntlCD}$ generated by the DLL loops as shown in FIG. 7.

Figure 8:
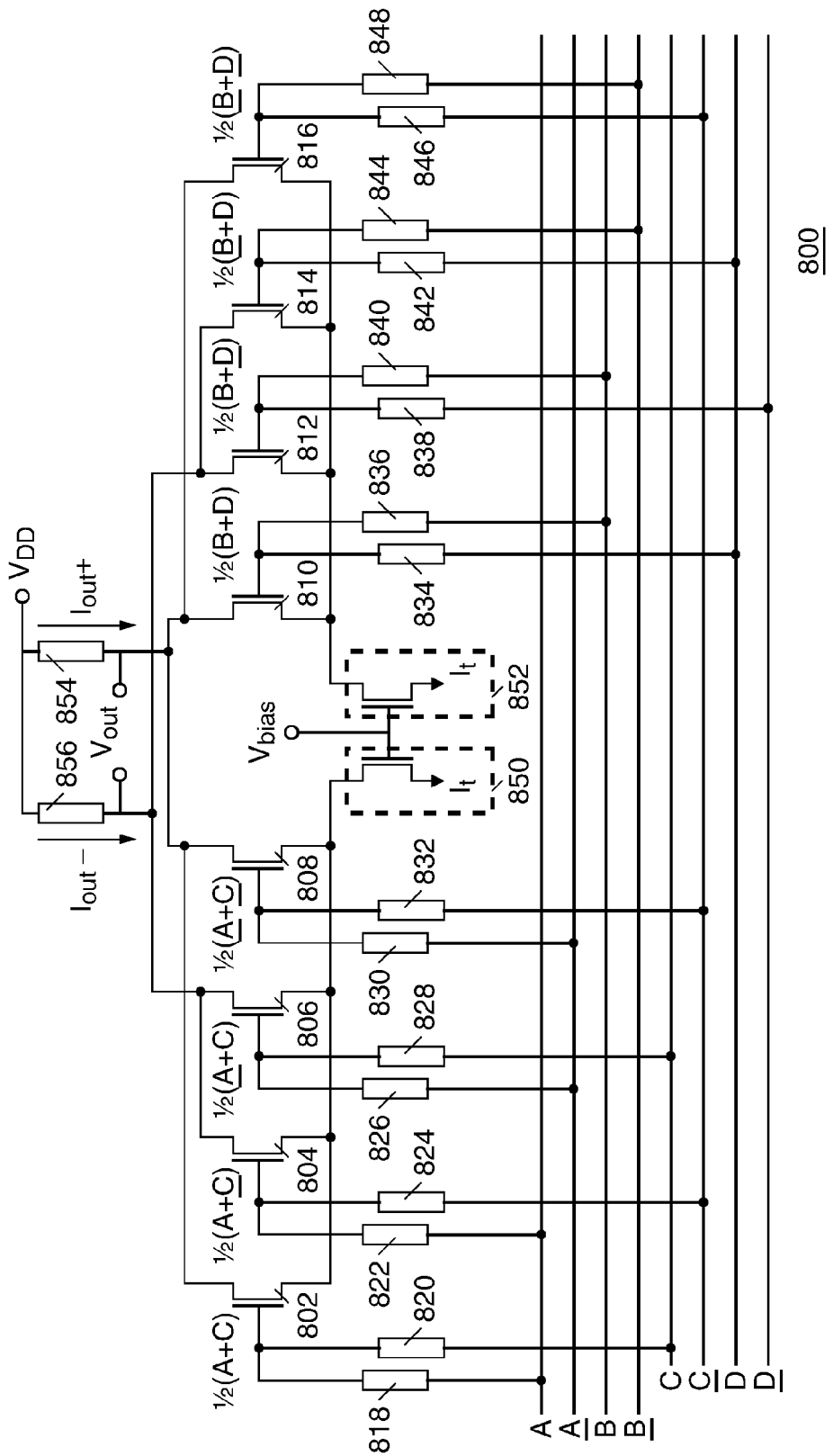
FIGS. 8-11 address a first embodiment of a phase-detector in the invention operating on four signals.
Figure 9:
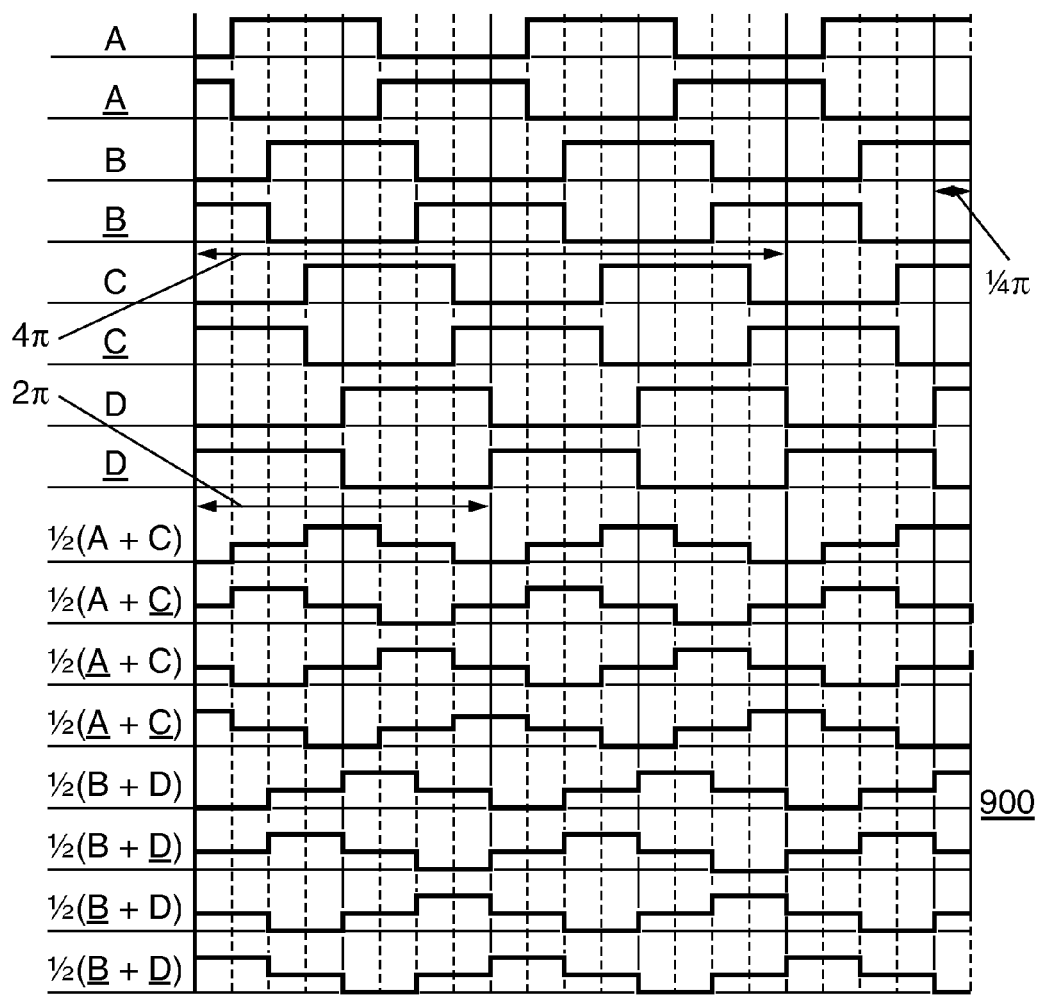

FIG. 8 is a circuit diagram of a first embodiment 800 of a phase-detector in the invention. Detector 800 is a symmetric π/4 phase-detector configuration that uses two symmetric π/2 phase-detectors. The new π/4 phase-detector operation principle is described in the diagram of FIG. 9. In FIGS. 8 and 9, the indications "A" and "A" (A underscored) indicate the signal A and its logic complement, respectively. A similar notation is used for signals "B", "C" and "D".

Detector 800 comprises transistors 802, 804, 806, 806, 808, 810, 812, 814 and 816. Detector 800 further comprises resistors 818, 820, 822, 824, 826, 828, 828, 830, 832, 834, 836, 838, 840, 842, 844, 846 and 848. In this example, resistors 818-848 have equal resistance values. Transistor 802 receives at its control input a voltage that is proportional to the mean value of the existing voltages of signals A and signal C. Transistor 804 receives at its control input a voltage that is proportional to the mean value of the existing voltages of signals A and signal C. Transistor 806 receives at its control input a voltage that is proportional to the mean value of the existing voltages of signals A and signal C. Transistor 808 receives at its control input a voltage that is proportional to the mean value of the existing voltages of signals A and signal C. Transistor 810 receives at its control input a voltage that is proportional to the mean value of the existing voltages of signals B and signal D. Transistor 812 receives at its control input a voltage that is proportional to the mean value of the existing voltages of signals B and signal D. Transistor 814 receives at its control input a voltage that is proportional to the mean value of the existing voltages of signals B and signal D. Transistor 816 receives at its control input a voltage that is proportional to the mean value of the existing voltages of signals B and signal D. Transistors 802-808 have their sources connected to one another and to a current source 850. Transistors 810-816 have their sources connected together and to a current source 852. In the example, current sources 850 and 852 supply currents of equal magnitude. Transistors 802 and 808 have their drains connected to each other and to a supply voltage $V_{DD}$ via a resistor 854. Transistors 804 and 806 have their drains connected to each other and to supply voltage $V_{DD}$ via a resistor 856. Transistors 810 and 816 have their drains connected to each other and to supply voltage $V_{DD}$ via resistor 854. Transistors 812 and 814 have their drains connected to each other and to supply voltage $V_{DD}$ via a resistor 856.

FIG. 9 is a diagram 900 showing elementary signals A, B, C and D, their logic compliments A, B, C, and D, and the composite input signals supplied to transistors 802-816 for a period of 4π of the elementary signal.

Figure 10:
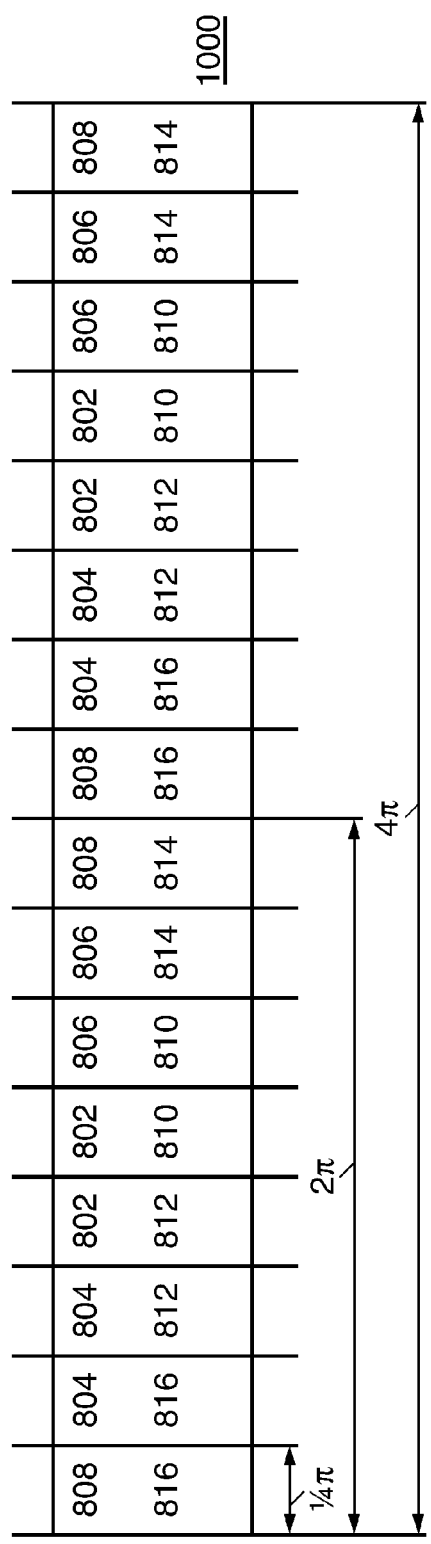

FIG. 10 is a diagram 1000 indicating which ones of transistors 802-816 are active per interval of ¼π It length on the same time basis as shown in diagram 900.

For example in the interval between ¾π and π, transistors 802 and 812 are active.

Figure 11:
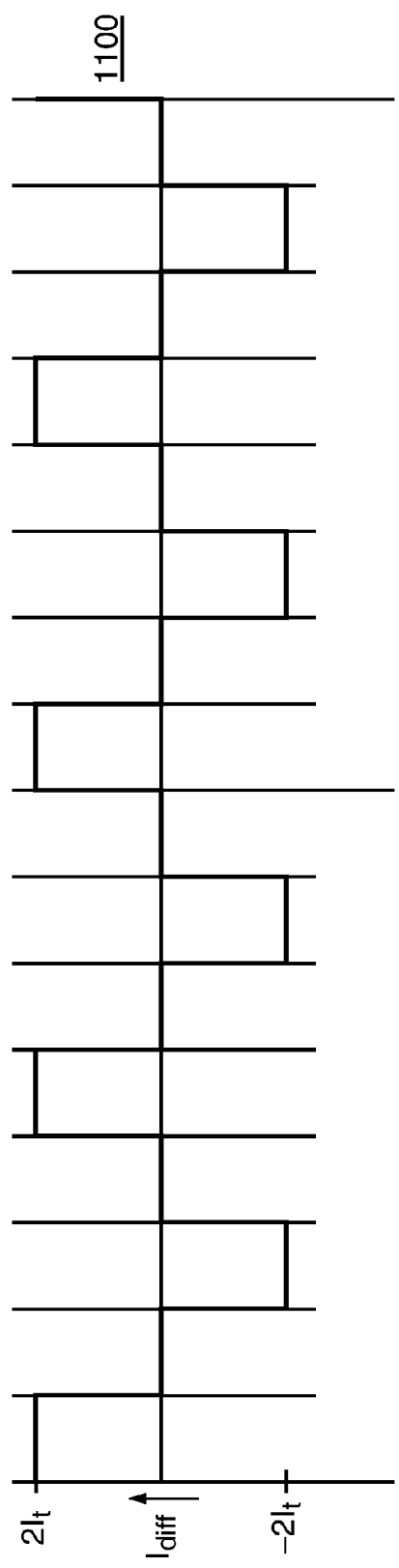

FIG. 11 is a diagram 1100 indicating the differential output current $I_{out}$ flowing through resistors 854 and 856 on the same time basis as shown in diagram 900. The magnitude of differential output current $I_{out}$ varies periodically between the values $2I_t$ and $-2I_t$, wherein $I_t$ is the magnitude of the tail currents of sources 850 and 852. Integrating differential output current $I_{out}$ over an input cycle of length 2π (or of length π times another even number) gives a result indicative of a residual current. The result is zero if the phase difference between a pair of successive ones of elementary signals A, B, C and D is exactly 45°. If the phase difference between a pair differs from 45°, the integration produces a non-zero result as a result of a non-zero average residual current. The magnitude of the residual current is proportional to the deviation of the phase difference of 45°. The output current is converted to an output voltage $V_{out}$ via resistors 854 and 856.

Detector 800 is a symmetric π/4 phase-detector configuration that uses two symmetric π/2 phase-detectors connected in parallel to the detector output that supplies $V_{out}$. One π/2 phase-detector involves transistors 802, 804, 806 and 808, and the other one involves transistors 810, 812, 814 and 816. A particular one of these two π/2 phase-detectors has a single transistor active each instant, so that π/4 phase-detector 800 has two transistors active per instant, as illustrated in FIG. 10.

The configuration of detector 800 can be generalized to a $\pi/(2^N)$ phase-detector, wherein the integer "N" can assume the values 2, 3, 4, . . . , etc. Such a $\pi/(2^N)$ phase-detector has then a number of $2^{(N-1)}\pi/2$ phase-detectors connected in parallel to the output, and each particular one of the $2^{(N-1)}\pi/2$ phase-detectors receives at its inputs the weighted combinations of two signals and their logic complements. In the generalized $\pi/(2^N)$ phase-detector, a number of N transistors are active each instant.

Despite the nice symmetric operation of π/4 phase-detector 800, detector 800 does not provide any indication at its output about which ones of the input signals A, B, C and D is hampered by an inaccuracy in the required 45° phase differences. Therefore, detector 800 cannot be used as a phase detector for the DLL of in FIG. 7. However, detector 800 can be used to detect when the π/4 calibration process is finished by sensing the output current from π/4 phase-detector.

Figure 12:
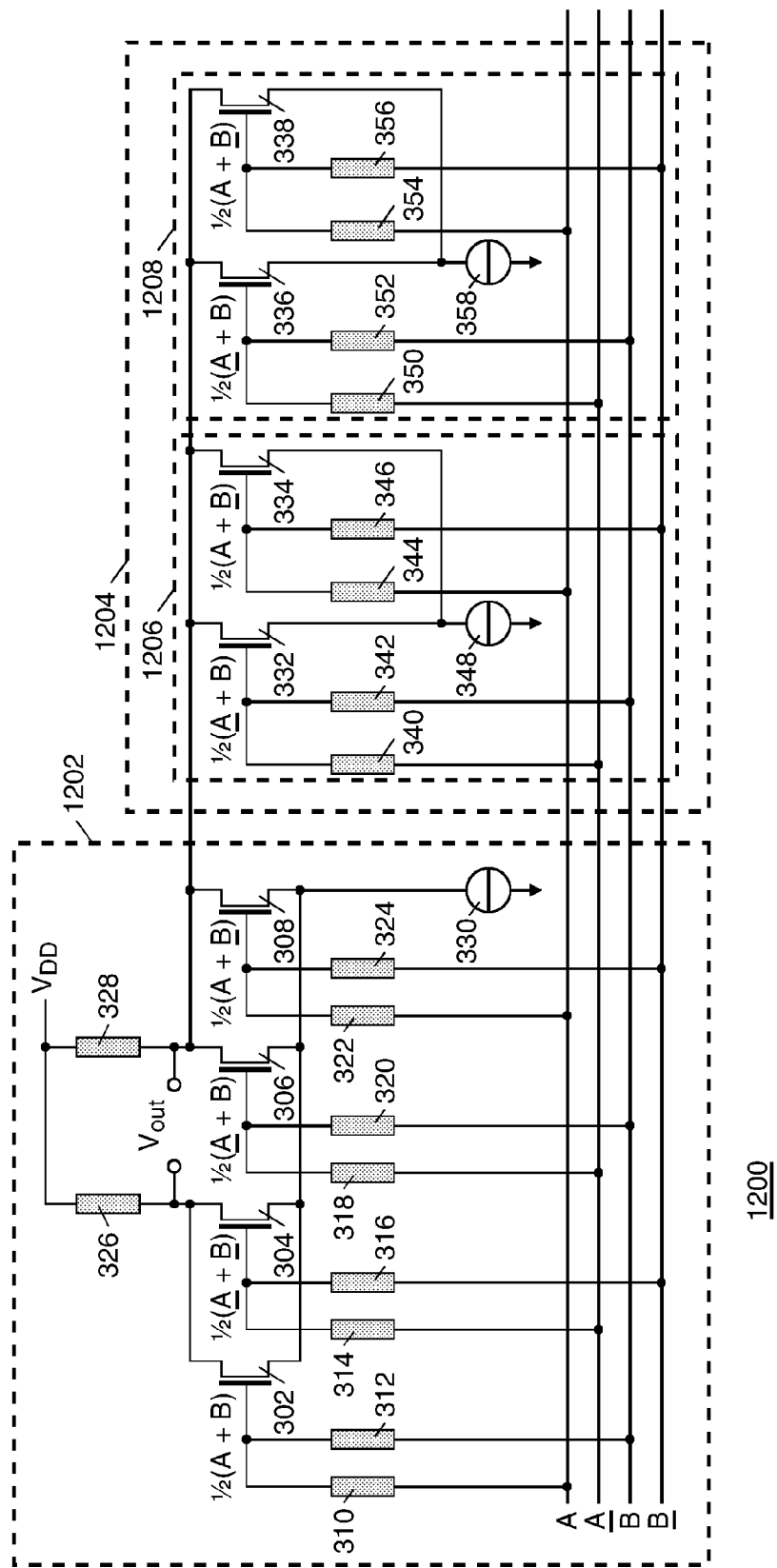
FIGS. 12-15 address a phase-detector in the invention for detecting any phase-difference between two signals.

FIG. 12 is a diagram of a second embodiment 1200 of a symmetric π/4 phase-detector by making use of one π/2 phase-detector. The operation of detector 1200 is described with reference to diagram 1300 in FIG. 13. Detector 1200 has input signals A and B and their logic complements $\overline{A}$ and $\overline{B}$.

Detector 1200 comprises a sub-circuit 1202 that has transistors 302, 304, 306 and 308, and resistors 310, 312, 314, 316, 318, 320, 322, 324, 326 and 328, and a current source 330 supplying a tail current of magnitude $I_t$. In this example, resistors 310-324 have identical resistance values, and resistors 326 and 328 have identical resistance values. Transistors 302 and 304 have their main current channels connected in parallel between resistor 326 and current source 330. Transistors 306 and 308 have their main current channels connected in parallel between resistor 328 and current source 330. Transistor 302 receives at its control input a voltage representative of ½(A+B). Transistor 304 receives at its control input a voltage representative of ½($\overline{A}$+B). Transistor 306 receives at its control input a voltage representative of ½(A+$\overline{B}$). Transistor 308 receives at its control input a voltage representative of ½($\overline{A}$+$\overline{B}$).

Figure 13:
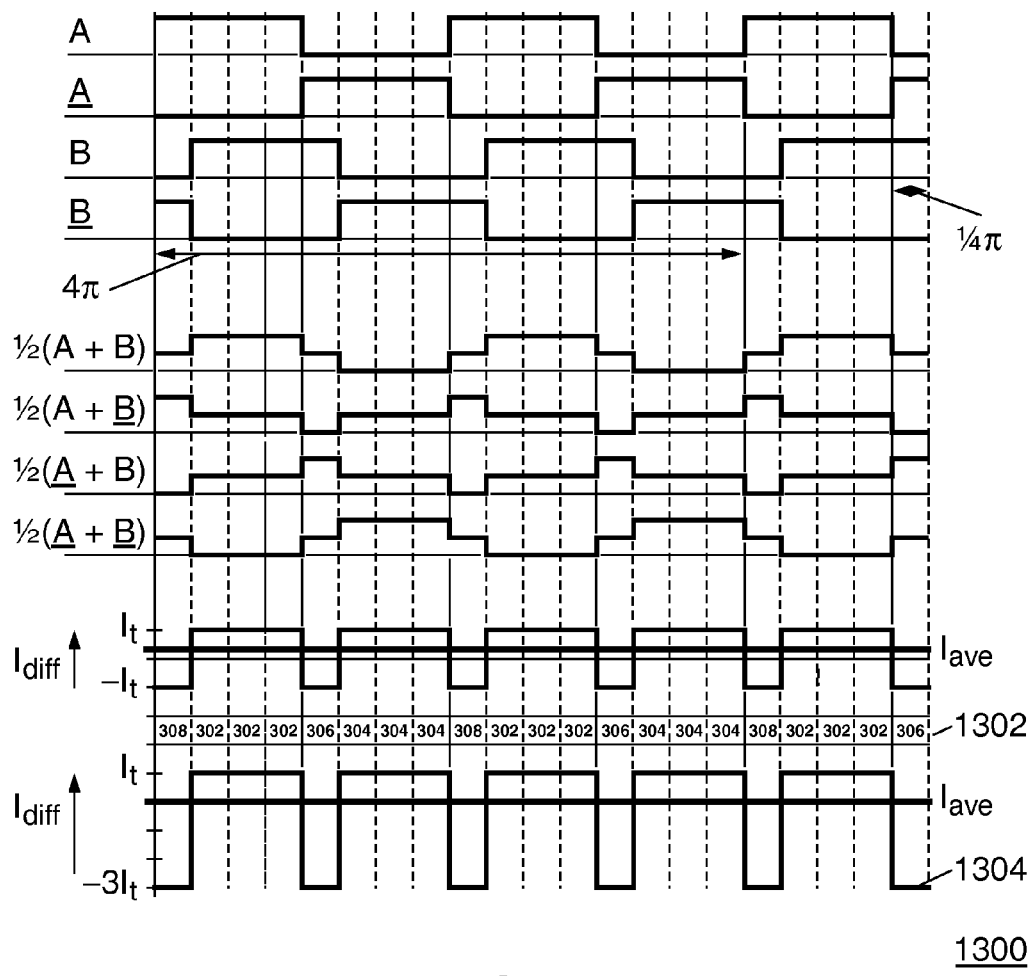

FIG. 13 is a diagram 1300 that shows the values of the signals A and B and their logic complements $\overline{A}$ and $\overline{B}$. Signals A and B are similar but have a 45° phase difference. Diagram 1300 also shows the signals ½(A+B), ½(A+$\overline{B}$), ½($\overline{A}$+B) and ½($\overline{A}$+$\overline{B}$). and the differential output current $\overline{I_{diff}}$ through resistors 326 and 328. A similar signal is obtained by monitoring the output voltage $V_{out}$. Reference numeral 1302 is a sequence of reference numerals to transistors 302-308 indicating which one of transistors 302-308 is active in the relevant time period spanning a phase interval of ¼π length. Note that the duty cycle of the signals $I_{diff}$ and $V_{out}$ is 75% in the example: for three-quarters of the time the signal has a certain value of one polarity and for one quarter of the time the signal has the same value with the opposite polarity. As a result, the time-averaged output signal, e.g., the time-averaged output current $I_{ave}$ has a value different from zero. In the example shown, the time-averaged output current $I_{ave}$ has a value of ½$I_t$.

In principle, one could use measurement circuitry to detect any deviation from this non-zero time-averaged value, but it is more convenient to measure a deviation from a zero-valued quantity. Therefore, in order to be able to produce a time average of zero, detector 1200 comprises calibration circuitry 1204. Calibration circuitry 1204 is to re-adjust the output signal, e.g., $I_{diff}$ so as to obtain a time average of zero. Circuitry 1204 comprises transistors 332, 334, 336 and 338; resistors 340, 342, 344, 346; 350, 352, 354 and 356; and current sources 348 and 358 that each supply a tail current of magnitude $I_t$ as does current source 330 in sub-circuit 1202. Again, resistors 340-346 and resistors 350-356 have the same resistance values as resistors 310-324 in sub-circuit 1202. Transistors 332 and 334 have their main current paths connected between resistor 328 (near the output of detector 1200) and current source 348. Transistors 336 and 338 have their main current paths connected between resistors 328 and current source 358. Transistors 332 and 336 receive at their control inputs a voltage representative of ½(A+$\overline{B}$). Transistors 334 and 338 receive at their control inputs a voltage representative of ½($\overline{A}$+B). As a result, transistors 332 and 336 are active when transistor 302 is active, and transistors 334 and 338 are active when transistor 308 is active. This then in turn results in a modification of output current $I_{diff}$ as indicated with reference numeral 1304. Note that the duty cycle is still 75%, but that the output current $I_{diff}$ now assumes a value of $I_t$ for three quarters of the time and a value of minus $3I_t$ for one quarter of the time. Accordingly, the time average of output current $I_{diff}$ is zero. Now, circuit 1200 can be used in a feedback loop to control the phase difference between signals A and B to be 45° using conventional control circuitry keeping a measured value at zero.

Figure 14:
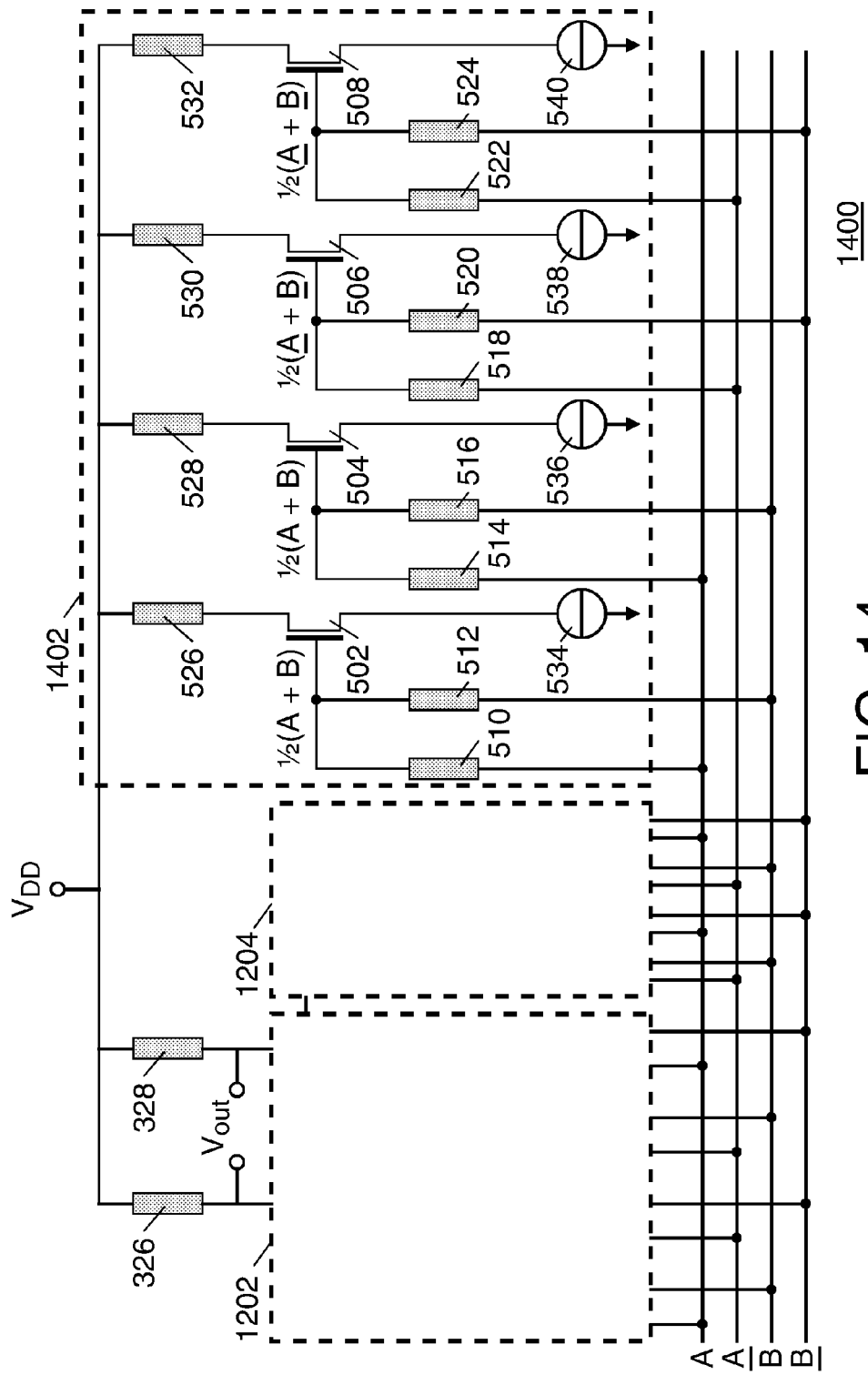

FIG. 14 is a diagram of a detector 1400 that includes a further improvement with respect to circuit 1200 in the form of a load balancing circuit 1402. Note that calibration circuitry 1204 distorts the symmetry of the loads of the lines carrying signals A, B, $\overline{A}$ and $\overline{B}$. Sub-circuit 1202 forms a symmetric load in the sense that each different pair of the lines carrying signals A, B, $\overline{A}$ and $\overline{B}$ is tapped once by sub-circuit 1202. Adding calibration circuit 1204 causes the following configuration. The pair of lines of signals A and B is tapped once by the combination of circuits 1202 and 1204. The pair of lines of signals $\overline{A}$ and B is tapped three times by the combination of circuits 1202 and 1204. The pair of lines of signals A and $\overline{B}$ is tapped three times by the combination of circuits 1202 and 1204. The pair of lines of signals $\overline{A}$ and $\overline{B}$ is tapped once by the combination of circuits 1202 and 1204. In order to restore a balanced load, circuit 1402 is added to detector 1200, resulting in the configuration of detector 1400, wherein circuits 1202 and 1204 are represented by boxes in order to not obscure the drawing.

Load balancing circuit 1402 comprises transistors 502, 504, 506 and 508; resistors 510, 512, 514, 516, 518, 520, 522 and 524; resistors 526, 528, 530 and 532; and current sources 534, 536, 538 and 540. Transistors 502 and 504 both receive an input signal of ½(A+B), and transistors 506 and 508 both receive the input signal of ½ ($\overline{A}$+$\overline{B}$). Transistor 502 has its main current channel connected between resistor 526 and current source 534. Transistor 504 has its main current channel connected between resistor 528 and current source 536. Transistor 506 has its main current channel connected between resistor 530 and current source 538. Transistor 508 has its main current channel connected between resistor 532 and current source 540. Resistors 526-532 are connected to supply voltage $V_{DD}$. Resistors 510-524 have the same resistance value equal to that of resistors 310-324 in this example. Current sources 534-540 supply a current of the same magnitude as sources 330, 348 and 358. As a result of this configuration, the loads on signal lines A, B, $\overline{A}$ and $\overline{B}$ are equalized, and the time-averaged output of detector 1400 is a more accurate representation of the deviation of the phase difference of 45°. Detectors 1200 and 1400 can be used in the DLL loop.

Similar to detector 800 as discussed above, the configurations of detector 1200 and 1400 can be generalized to implement a π/$2^N$ phase-detector. To this end, consider again diagram 1300 and output current $I_{diff}$ as indicated by reference numeral 1304. The course of output current $I_{diff}$ is determined by the combination of current drawn by circuit 1202 and the currents drawn by calibration circuit 1204. Circuit 1204 comprises two uniform cells 1206 and 1208 in the example shown. Assume now that calibration circuit 1204 is expanded to comprise an additional number of such cells, so that circuit 1204 comprises a number of M uniform cells of the type indicated by reference numeral 1206 or 1208. The maximum value of output current $I_{diff}$ remains equal to $I_t$, but the minimum value of output current $I_{diff}$ then becomes: minus (M+1) times $I_t$. The time average of $I_{diff}$ is to be zero in order to generate a control signal. Now, let the phase difference between signal A and signal B be α times π, the parameter α having a value between zero and unity. Accordingly, in order to have the time-averaged value of output current $I_{diff}$ equal to zero, the expression: $\alpha(M+1)=(1-\alpha)$ is to be valid. That is, for an intended phase difference of magnitude απ, there are needed M=1/α cells of the type indicated by reference numeral 1206 or 1208. That is, the value of α is set to 1/M, wherein M is an integer. For example, in order to implement a phase-detector for a phase difference of $\pi/2^N$ (i.e., for a value of α equal to $1/2^N$, a number of $M=2^N$ cells are needed in calibration circuit 1204. Load balancing circuit 1402 is then to be expanded accordingly to evenly distribute the number of taps to the signal lines A, A̅, B and B̅.

Figure 15:
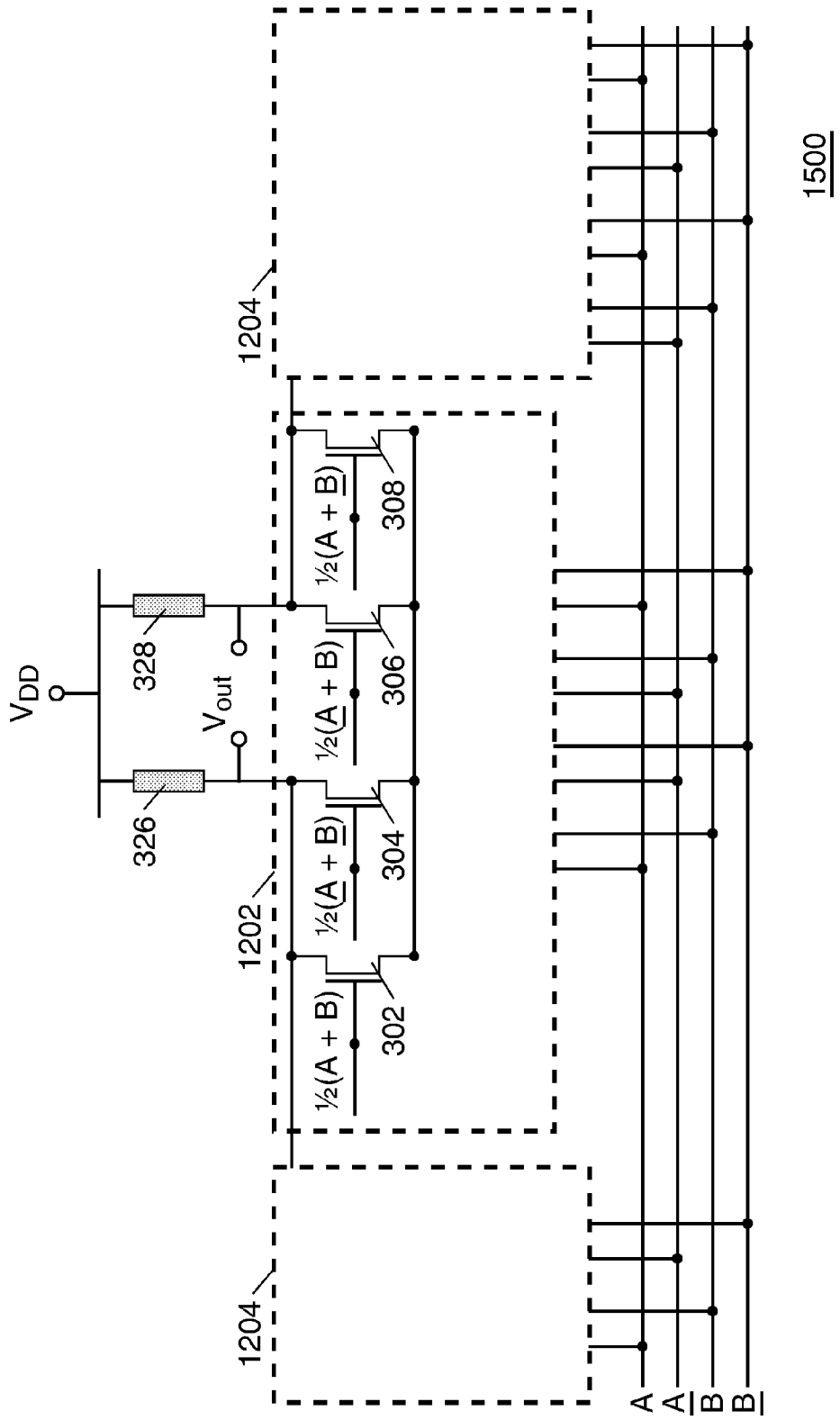

FIG. 15 is a diagram of a further generalization 1500 of detector 1200. Note that in detector 1200 calibration circuit 1204 is connected to a node between transistors 306 and 308 on the one hand, and resistor 328 on the other hand. Now consider adding also a calibration circuit with one or more further cells of similar configuration as that of cells 1206 or 1208. The one or more further cells are connected between a node, which connects resistor 326 to transistors 302 and 304, and signal lines A and B, or between that node and signal lines A̅ and B̅. That is, the further cells receive a copy of the signals received by transistors 302 and 304. Assume that calibration circuit 1204 comprises M cells and that further calibration circuit comprises K further cells. In this manner, the excursion of output current $I_{diff}$ that has a positive polarity can be set to P+1 times the magnitude of tail current $I_t$ and the excursion of output current $I_{diff}$ that has a negative polarity can be set to M+1 times the magnitude of tail current $I_t$. Now let the phase difference between signals A and B be set to α times π, the parameter α having a value between zero and unity. Again, in order to have the time-averaged value of output current $I_{diff}$ equal to zero, the expression: $\alpha(M+1)=(1-\alpha)(P+1)$ is to be valid. Accordingly, if the value of α is set to (P+1)/(M+P+2), the time averaged value of $I_{diff}$ is zero, thus having accomplished a phase detector for a phase difference of π(P+1)/(M+P+2). Again, additional load balancing circuitry restores the loads on signal lines A, A̅, B and B̅ by means of restoring the equal distribution of the taps among the signal lines.

Another variation on this theme can be implemented by means of varying the sizes of the transistors used in circuits 1202 and 1204, e.g., by means of using two transistors in parallel to double the effective size of specific ones of the transistors. Yet another variation can be obtained by varying the resistances of the resistors connecting circuits 1202 and 1204 to the signal lines. Yet another variation uses programmable connections to selectively connect or disconnect calibration cells, such as cells 1206 and 1208, from circuit 1202 in order to implement a phase detector with programmable phase.

The invention is applicable for all broadband and low frequency wireless and broadcast receivers that are used next to another receiver/transmitter in a small form-factor device, and therefore interfere with one another. Therefore, the invention is especially applicable to devices that are developed in the mobile and portable electronics domain, e.g., TV Front-End (TV-on-Portable); TV-on-Mobile, FM radio; devices operating using CDMA. The coexistence issues that can be addressed with this invention include: FM co-existence with 2G, 3G DVB-H/T, DVB-SSP, 802.11a/b/g/, Bluetooth; DVB-H/T co-existence with 2G, 3G DVB-H/T, DVB-SSP, 802.11a/b/g/, Bluetooth; T-DMB co-existence with 2G, 3G, 802.11a, DVB-H/T; ISDB-T co-existence with 2G, 3G, Bluetooth, 802.11a/b/g, DVB-H/T; CDMA45 co-existence with 2G, 3G DVB-H, Bluetooth, 802.11a/b/g.

The invention has been illustrated in the drawings by way of embodiments having single transistors being used as controllable current sources in the basic phase detector 1202, in the cells of calibration circuit 1204 and in the cells of load balancing circuit 1402. It is clear to the skilled person that a single controllable current source can be implemented by means of multiple transistors.

The invention claimed is:

1. An electronic device comprising:
electronic circuitry that has a phase-detector for detecting a phase difference between a first signal and a second signal, wherein:
each of the first and second signals is a binary signal;
the first and second signals are uniform;
the phase-detector includes a basic phase-detector for detecting a phase difference of π/2;
the basic phase-detector comprises:
a first controllable current source, having a first main current path, and a second controllable current source, having a second main current path, the first and second main current paths being connected in parallel between a first output node and a further current source, wherein the first output node is coupled to a reference voltage via a first resistor;
a third controllable current source, having a third main current path, and a fourth controllable current source, having a fourth main current path, the third and fourth main current paths being connected in parallel between a second output node and the further current source, wherein the second output node is coupled to the reference voltage via a second resistor;
the first controllable current source has a first control input for receiving a first input signal representative of a linear combination of the first and second signals;
the second controllable current source has a second control input for receiving a second input signal representative of a linear combination of a logic complement of the first signal and a logic complement of the second signal;
the third controllable current source has a third control input for receiving a third input signal representative of a linear combination of the second signal and a logic complement of the first signal;
the fourth controllable current source has a fourth control input for receiving a fourth input signal representative of a linear combination of the first signal and a logic complement of the second signal;
the phase detector has a calibration circuit that comprises one or more first cells connected to the second output node;
each respective one of the first cells comprises a respective fifth controllable current source, having a respective fifth main current path, and a respective sixth controllable current source having a respective sixth main current path, the respective fifth and respective sixth main current paths being connected in parallel between the second output node and a respective first current source;
the respective fifth controllable current source has a respective fifth control input for receiving the third input signal; and
the respective sixth controllable current source has a respective sixth control input for receiving the fourth input signal.

2. The device of claim 1, wherein:
the phase-detector comprises a load balancing circuit comprising at least one third cell;
each respective one of the third cells comprises a respective ninth controllable current source, having a respective ninth main current path connected between a respective third current source and a respective third resistor;

the respective third resistor is connected to the reference voltage; and the respective ninth controllable current source has a respective ninth control input for receiving one of the first input signal and the second input signal.

3. The device of claim 1, wherein:

the calibration circuit comprises at least one second cell connected to the first output node;

each respective one of the second cells comprises a respective seventh controllable current source, having a seventh main current path, and a respective eighth controllable current source, having a respective eighth main current path, the respective seventh and respective eighth main current paths being connected in parallel between the first output node and a respective second current source;

the respective seventh controllable current source has a respective seventh control input for receiving the first input signal; and the respective eighth controllable current source has a respective eighth control input for receving the second input signal.

4. The device of claim 3, wherein:

the phase-detector comprises a load balancing circuit having at least one fourth cell;

each respective one of the fourth cells comprises a respective tenth controllable current source having a respective tenth main current path connected between a respective fourth current source and a respective fourth resistor;

the respective fourth resistor is connected to the reference voltage; and the respective tenth controllable current source has a respective tenth control input for receiving either the third input signal or the fourth input signal.

5. Electronic circuitry having the phase-detector for use in the device of claim 1.

* * * * *